United States Patent [19]
Fujio et al.

[11] Patent Number: 5,936,886
[45] Date of Patent: Aug. 10, 1999

[54] SEMICONDUCTOR MEMORY DEVICE HAVING REDUCED VARIATION OF ERASING AND WRITING VOLTAGES SUPPLIED TO EACH MEMORY ARRAY

[75] Inventors: Ryosuke Fujio; Mitsuru Sekiguchi, both of Tokyo, Japan

[73] Assignee: NEC Corporation, Tokyo, Japan

[21] Appl. No.: 08/953,995

[22] Filed: Oct. 20, 1997

[30] Foreign Application Priority Data

Oct. 21, 1996 [JP] Japan ................................ 8-277822

[51] Int. Cl.$^6$ ................................................ G11C 11/34
[52] U.S. Cl. ............................. 365/185.11; 365/226
[58] Field of Search ........................... 365/230.03, 226, 365/185.33

[56] References Cited

U.S. PATENT DOCUMENTS

| | | | |
|---|---|---|---|
| 5,280,447 | 1/1994 | Hazen et al. ................. | 365/230.03 |
| 5,422,845 | 6/1995 | Ong ............................... | 365/174 |
| 5,511,022 | 4/1996 | Yim et al. ..................... | 365/185.27 |
| 5,579,274 | 11/1996 | Van Buskirk et al. ....... | 365/185.33 |
| 5,719,490 | 2/1998 | Germini ........................ | 365/226 |

FOREIGN PATENT DOCUMENTS 63-144560  6/1988  Japan .
6-325584  11/1994  Japan .

*Primary Examiner*—Do Hyun Yoo
*Assistant Examiner*—M. Tran
*Attorney, Agent, or Firm*—Sughrue, Mion, Zinn, Macpeak & Seas, PLLC

[57] ABSTRACT

In a semiconductor memory device comprising a plurality of memory arrays, the memory array is given a predetermined potential from a terminal via a reference line. Further, a plurality of source switches are connected to the memory arrays and the reference line. The source switches selectively transfer the predetermined potential to each of the memory arrays. In this case, each of the source switches includes a transistor having an electrical ability which is determined by a length of the reference line between each source switch and the terminal.

When the transistor is formed by a MOS transistor, the above electrical ability is specified by the ON resistance of the MOS transistor. The MOS transistors are designed so that the ON resistance becomes lower as the length of the reference line between the source switch and the terminal becomes longer. At any rate, a substantially constant voltage is supplied to each of the memory arrays irrelevant of the length of the reference line between each source switch and the terminal.

23 Claims, 5 Drawing Sheets

SEMICONDUCTOR MEMORY DEVICE HAVING REDUCED VARIATION OF ERASING AND WRITING VOLTAGES SUPPLIED TO EACH MEMORY ARRAY

BACKGROUND OF THE INVENTION

This invention relates to a semiconductor memory device and, in particular, to a semiconductor memory device having a plurality of programmable and erasable non-volatile memory cells.

A conventional semiconductor memory device of the type described includes a non-volatile semiconductor memory device which has a plurality of programmable and erasable non-volatile memory cells. Such each non-volatile memory cell has a double gate structure which is formed by a control gate and a floating gate.

Further, the non-volatile semiconductor memory device may be classified into a flash memory wherein a plurality of memory cells are erased once and an EEPROM wherein each of memory cells is selectively erased.

In addition, various kinds of memory cells have been proposed one of which utilizes Fowler-Nordheim (F-N) tunneling phenomenon during erasing and writing operations and another of which utilizes the F-N tunneling phenomenon during the erasing operation and injection of hot electrons into the floating gate during the writing operation.

It is common to any one of the non-volatile semiconductor devices mentioned above that a threshold value of the memory cell is changed from one to another during the erasing operation and the writing operation.

At any rate, each memory cell has a source, a drain and a double gate structure as described above. In this case, voltages which are given to the source, the drain and the control gate in a reading operation are different from those in the erasing operation and the writing operation. This is because the threshold values of the memory cell should be changed during the erasing and the writing operations, as mentioned before. Therefore, a voltage control circuit is normally included in the non-volatile semiconductor device.

Subsequently, description will be made in detail about the writing and erasing operations of the memory cell. In this event, the writing operation is carried out by injecting the hot electrons from the drain into the floating gate, while the erasing operation is made by the use of the F-N tunneling phenomenon.

More particularly, the writing operation is carried out by giving a high voltage of about 12V and a voltage of 6V to the control gate and the drain, respectively. Under the circumstances, the source is grounded and thereby, the hot electrons which are generated between the drain and the source are injected into the floating gate from an edge of the drain. Such injection of the hot electrons raises the threshold value.

On the other hand, the erasing operation is carried out by giving a high voltage of 12V to the source on the condition that the control gate and the drain are grounded and opened, respectively. Alternatively, a negative high voltage may be given to the control gate during the erasing operation on the condition that the drain and the source are opened and supplied with a voltage of 5V, respectively. In either one of the above mentioned cases, a high electric field is generated between the floating gate and the source. The electrons injected into the floating gate are drawn from an edge of the source by the F-N tunneling phenomenon. As a result, the threshold value of the memory cell is reduced.

Thus, desired voltages are inevitably applied to the drain, the source, and the control gate from the above voltage control circuit during the writing and erasing operations.

Recently, the number of the memory cells in the flash memory is increased with an increase of a memory capacity in the semiconductor memory device. In this case, proposal has been made about a flash memory in which the memory cells are divided into a desired number of blocks (namely, memory arrays). With such a structure, the erasing operation can be carried out at every one of the blocks.

In such a flash memory, a plurality of blocks are arranged in a desired direction. The sources of the memory cells in each block are commonly connected to each of source switches for selectively supplying an erasing voltage for each block. The source switches are connected to a power supply pad for supplying the erasing voltage via an erasing voltage supply line.

With such a structure, as the blocks are increased in number, the length of each erasing voltage supply line between the power supply pad and each source switch becomes long. In this case, the erasing voltage supply line has a distribution resistance dependent on a wiring width and a wiring thickness. This shows that the distribution resistance is minimum when the block is closest to the power supply pad. On the other hand, the distribution resistance is maximum when the block is farthest from the power supply pad.

In this structure, let an erasing voltage of a pulse shape be supplied from the power supply pad to the respective blocks. In this case, a highest voltage is given to the closest block, while a lower voltage is given to a farther block from the power supply pad. Thus, fluctuation of the erasing voltage in each block takes place and results in a difference among the threshold values in the blocks after the memory cells are erased in the blocks. Thereby, an operating margin is reduced on a minimum value side of a power supply voltage in the flash memory.

To solve such a problem, Japanese Unexamined Patent Publication No. H6-325584 (hereinafter, called a reference) discloses that a smoothing resistance is connected in accordance with a position of each block between the source switch and a branch point of the erasing voltage supply line. In this case, a larger smoothing resistance is connected to the block closer to the power supply pad, while a lower smoothing resistance is connected to the block farther from the power supply pad. Thus, resistance values of a path from the power supply pad to the source switch via the erasing voltage supply line and the smoothing resistance are equalized to one another and the number of the erasing pulses is also adjusted during the erasing operation. With this structure, it is possible to adjust the difference of erasing voltage levels given to each block via the source switch by adjusting with the number of the erasing pulses. As a result, the fluctuation of the threshold levels in each block cells can be reduced after erasing the memory.

In the reference, an attention is directed to only reduction of the fluctuation of the threshold value after erasing the memory cell. However, no attention is paid for a variation of a ground potential of the source that might occur in each memory cell during the writing operation. Further, no suggestion is made about an influence due to the variation of the ground potential in the reference.

Further, if the smoothing resistances are connected to each block like in the reference, the number of the resistances is increased with an increase of the block number. Therefore, the equalization of the erasing voltage due to the resistances brings about an increase of both a chip size and a power consumption. Further, it is difficult from a viewpoint of a design to provide the smoothing resistances having the different resistance values for the respective blocks like in the reference.

SUMMARY OF THE INVENTION

It is an object of this invention to provide a semiconductor memory device which is capable of reducing the voltage fluctuation generated during writing operation for each block.

It is an another object of this invention to provide a semiconductor memory device which is capable of reducing a variation of a ground potential during a writing operation.

It is a still another object of this invention to provide a semiconductor memory device which is capable of flexibly coping with a change of a block number in design.

It is a still further object of this invention to provide a semiconductor memory device which is capable of reducing a fluctuation of a threshold value in each block during an erasing operation.

According to this invention, a memory device is divided into a plurality of memory arrays. The memory array is given a predetermined potential from a terminal via a reference line. Further, a plurality of source switches connected to the memory arrays and the reference line. The source switches selectively gives the predetermined potential to each of the memory arrays. In this case, each of the source switches includes a transistor having a predetermined ability. This ability is determined by a length of the reference line between each source switch and said terminal.

The transistor is, for example, a MOS transistor, and the above ability is specified by the ON resistance of the MOS transistor. The MOS transistors are designed so that the ON resistance becomes lower as the length of the reference line between the source switch and the terminal becomes longer. Specifically, the ON resistance is determined by the width of a channel region of the MOS transistor, and the width becomes wider as the length of the reference line becomes longer. Further, the ON resistance is determined by the length of the channel region, and the length of the channel region becomes shorter as the length of the reference line becomes longer. In addition, the ON resistance is determined by a gate voltage, and the gate voltage becomes higher as the length of the reference line becomes longer. Thus, according to this invention, a substantially constant voltage is supplied to each of the memory arrays irrelevant of a length of the reference line between each source switch and said terminal.

DESCRIPTION OF THE PREFERRED EMBODIMENTS

First Embodiment

Referring to drawings, an embodiment of this invention will be described below.

Figure 1:
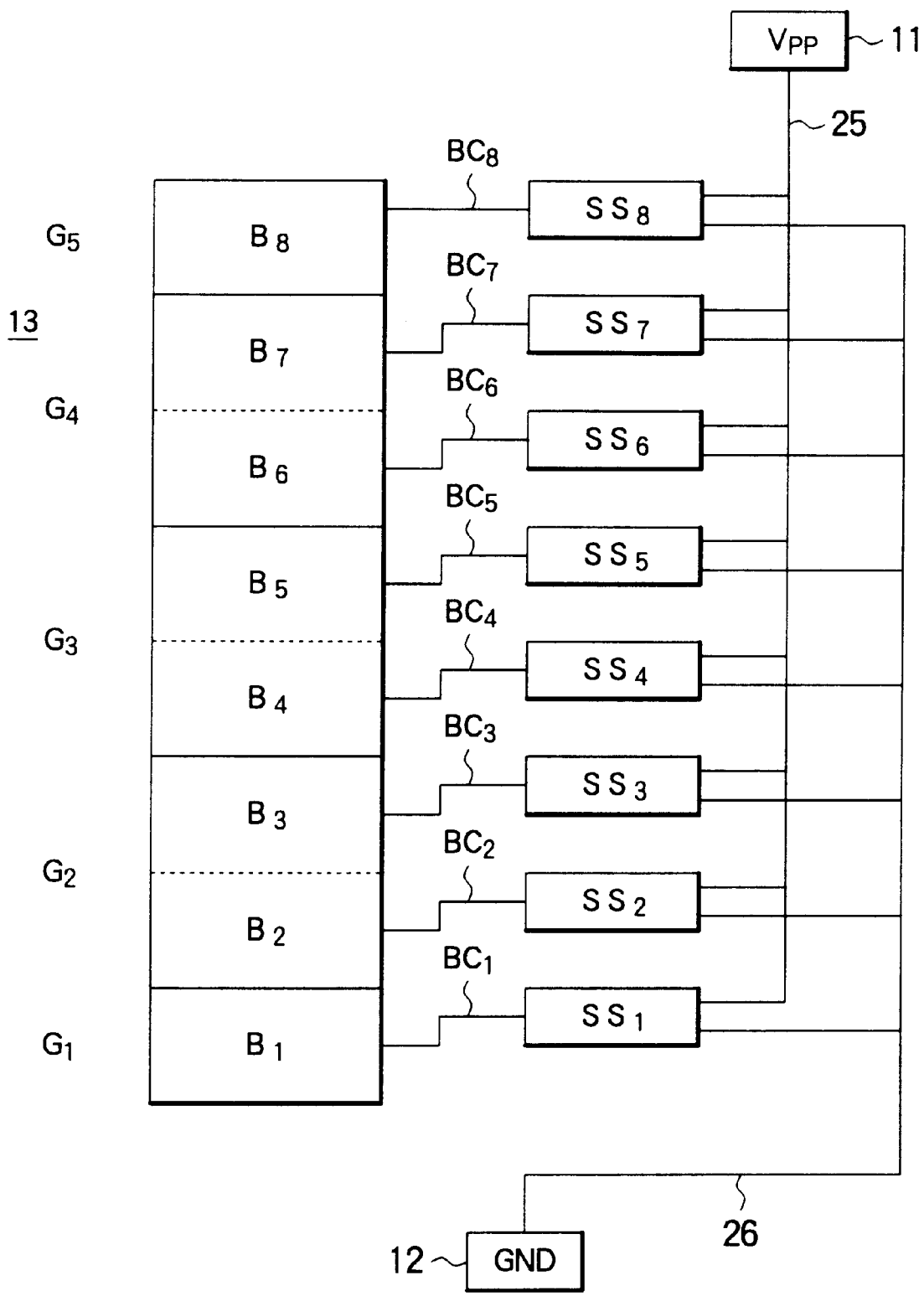
FIG. 1 shows a block diagram of a semiconductor memory device according to a first embodiment of this invention.

In FIG. 1, the illustrated semiconductor memory device comprises a power supply terminal 11 (namely, a power supply pad) to be supplied with a high voltage VPP of about 12V, a ground pad 12 to be grounded and a memory portion 13 structured by non-volatile memory cells. The illustrated memory portion 13 is divided into eight blocks (namely, arrays). Each of the blocks B1–B8 has a memory capacity of 512 Kbit. Also, the illustrated blocks B1 to B8 are divided into five groups G1–G5.

As shown in FIG. 1, the group 1 is composed of only the block B1 closest to the ground pad 12, while the group G2 is composed of the block B2 and B3. Likewise, the group G3, the group G4 and the group G5 are composed of the blocks B4 and B5, the blocks B6 and B7 and the block B8 which is farthest from the ground pad 12, respectively.

Figure 2:
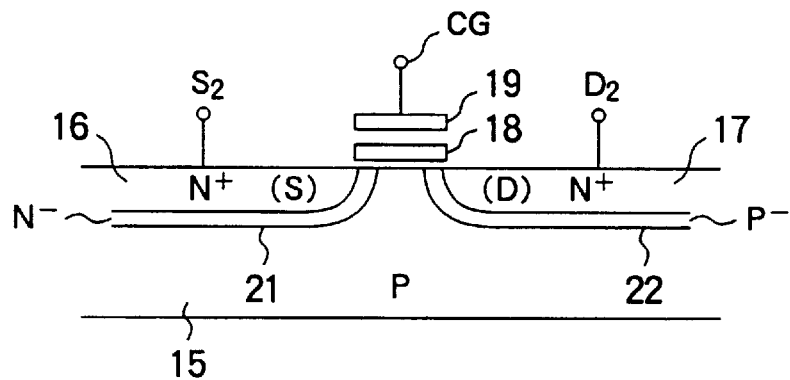
FIG. 2 shows an example of a memory cell used in the semiconductor memory device in FIG. 1.

As illustrated in FIG. 2, the non-volatile memory cell in each of the blocks B1 to B8 includes an $N^+$ source region (S) 16 and an $N^+$ drain region (D) 17 which are formed with a desired interval kept therebetween in a P-type substrate 15. A floating gate 18 is also arranged between the source and drain regions 16 and 17 via a thin gate insulating film (not shown), while a control gate 19 is also arranged on the floating gate 18 via an insulating film. In this example, the source region 16 is surrounded by an outer $N^-$ region 21, while the drain region 17 is surrounded by an outer $P^-$ region 22. In addition, a source terminal S2, a drain terminal D2 and a gate terminal CG are taken out from the source region 16, the drain region 17 and the control gate 19, respectively.

In the above memory cell, an erasing operation is carried out by using the F-N tunneling phenomenon, while a writing operation is performed by generating hot electrons between the source region 16 and the drain region 17. Concretely, a high voltage of 12V is given to the source region 16 via the source terminal S2 on the condition that the control gate 19 is grounded. Thereby, the F-N tunneling phenomenon occurs in the insulating film between the floating gate 18 and the source region 16. Consequently, the electrons are released from the floating gate 18. Thus, the erasing operation is carried out. As a result, the threshold value of the memory cell is lowered.

On the other hand, a high voltage of 12V is given to the control gate terminal CG, while an intermediate potential of about 5V is given to the drain terminal D2, with the source terminal grounded. As a result, hot electrons are generated between the source region 16 and the drain region 17. The writing operation is performed by injecting the electrons into the floating gate 18. Such injection of electrons raises the threshold value.

As mentioned above, the high voltage of 12V is given to the source terminal S2 of the memory cell shown in FIG. 2 during the erasing operation, while the ground potential is given thereto during the writing operation.

Turning back to FIG. 1, each of source switches SS1 to SS8 is provided for each of the blocks B1 to B8 to selectively supply the high voltage VPP and the ground potential to the source terminal S2 during the erasing and writing operations. In other words, the source terminals S2 of the memory cells in each block B1 to B8 are commonly connected to the corresponding source switch SS1 to SS8 via block (array) common wiring BC1 to BC8. The source switches SS1–SS8 are connected to the power supply pad 11 for supplying the high voltage VPP via an erasing voltage supply wiring 25. Also, the source switches SS1–SS8 are connected to the ground pad 12 via a ground wiring 26. In this case, the ground wiring 26 may be referred to as a reference power supply line because the ground wiring 26 serves to supply the ground potential as a reference potential.

In this case, as the number of the blocks in the memory portion 13 is increased, the length of each of the erasing voltage supply wiring line 25 and the ground wiring 26 becomes long. Thus, when the wiring lines 25 and 26 become long, each of the wirings 25 and 26 has a resistance and a capacity corresponding to the wiring length from each block to the pads 11 and 12. As a result, the resistance and the capacity are changed in with each block. Therefore, the writing and erasing characteristic of each block B1 to B8 indicates a block dependency due to the resistance and the capacity of the wirings 25 and 26.

In particular, when the ground pad 12 is grounded during the writing operation, the potential given via the source switches SS1 to SS8 is varied (floated) from the ground potential depending on the resistance of the ground wiring 26 as the block becomes far from the ground pad 12. Consequently, the potential difference between the source and the drain in the each memory cell is reduced, and thereby the current is reduced. Thus, where the current given to the memory cell is reduced, a decrease takes place in the number of the hot electrons generated. As a result, the writing duration becomes long and the writing level becomes low.

Figure 3:
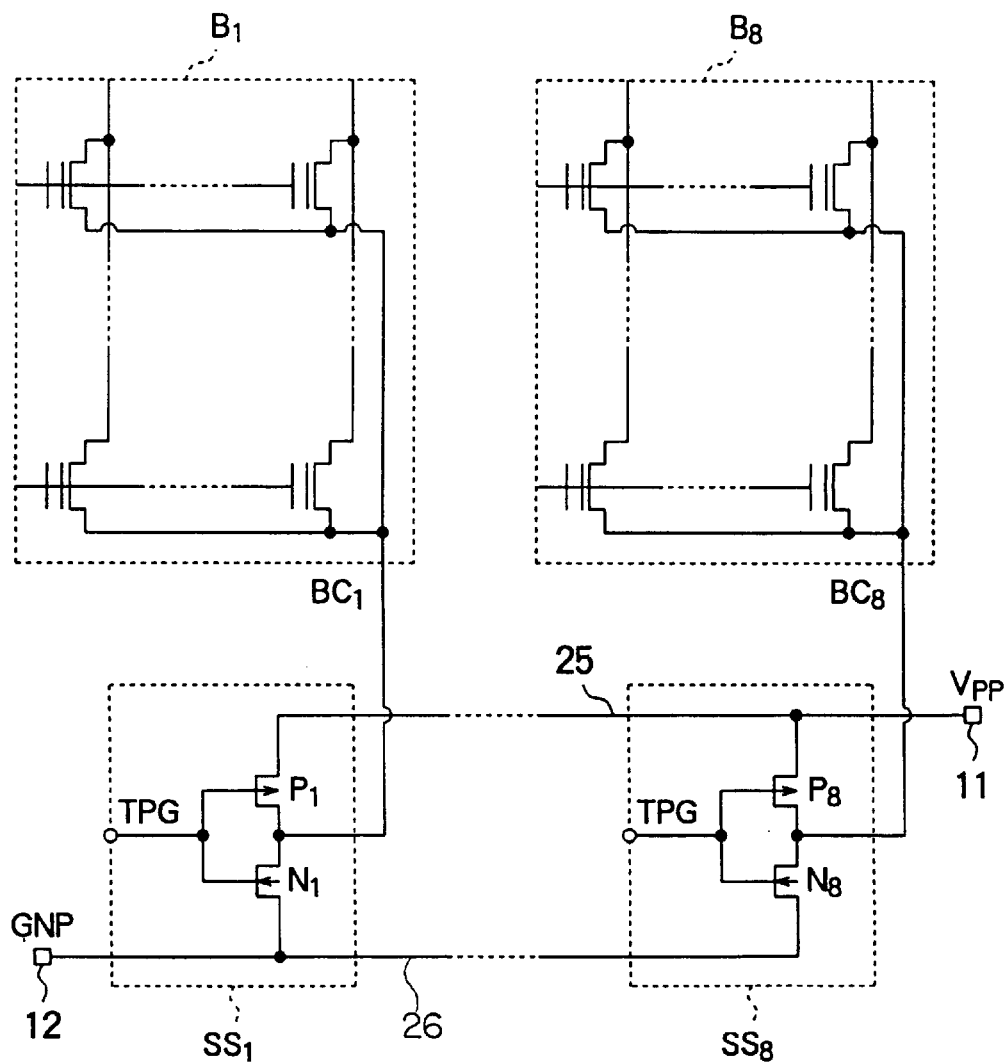
FIG. 3 shows a detail circuit structure of the semiconductor device in FIG. 1.

Referring to FIG. 3, the block B1 closest to the ground pad 12 and the block B8 farthest from the ground pad 12 are connected to the corresponding source switches SS1 and SS8, respectively. Each of the memory cells in the blocks B1 and B8 has the structure shown in FIG. 2 and is connected to a word line and a bit line in a known manner. Further, the sources of the memory cells in the blocks B1 to B8 are commonly connected to block common wirings BC1 to BC8, respectively. The block common wirings BC1–BC8 are connected to the source switches SS1 to SS8, respectively. Although each of source switches SS1 to SS8 has the same circuit structure, as represented by SS1 and SS8, the sizes of the device constituting the circuits are different from one another as will described later.

In more detail, both the source switch SS1 closest to the ground pad 12 and the source switch SS8 farthest from the ground pad 12 are composed of a N-channel MOS transistor and a P-channel MOS transistor. The N-channel and P-channel MOS transistors are connected to the ground wiring 26 and the erasing voltage supply wiring 25, respectively. Further, the source of the N-channel MOS transistor (N1) is connected to the ground wiring 26, while the drain thereof is connected to the drain of the P-channel MOS transistor. The commonly connected drains of the both transistor N1 and P1 are connected to the block common wiring BC1. On the other hand, the source of the P-channel MOS transistor P1 is connected to the erasing voltage supply wiring 25.

Similarly, the source of the N-channel MOS transistor (N8) in the source switch SS8 is connected to the ground wiring 26, while the drain thereof is connected to the drain of the P-channel MOS transistor P8. The commonly connected drains of the both transistor N8 and P8 are connected to the block common wiring BC8. On the other hand, the source of the P-channel MOS transistor P8 is connected to the erasing voltage supply wiring 25. Also, a program signal TPG is supplied to the commonly connected gate of each source switch SS1 to SS8.

As a result, each of the P-channel MOS transistors P1 to P8 becomes an ON state during the erasing operation, while each of the N-channel MOS transistors N1 to N8 becomes an ON state during the writing operation.

As mentioned above, the ground potential of the source switch SS8 farthest from the ground pad 12 is in the floating state as compared to the ground potential of the source switch SS1 adjacent to the ground pad 12, since the ground wiring has the resistance and the capacity. In order to reduce the fluctuation of the ground potential, the ability of the N-channel MOS transistor N8 in the source switch SS8 farthest from the ground pad 12 is higher than the ability of the N-channel MOS transistor in the source switch SS1 adjacent to the ground pad 12 in FIG. 3. Namely, the ON resistance of the N-channel MOS transistor N8 is lower than that of the N-channel MOS transistor N1. As a result, the fluctuation of the resistance due to the ground wiring 26 is balanced by the internal resistance (that is, ON resistance) of the transistor, and thereby the ground potential given to each block is equalized during the writing operation.

In this event, the ON resistance of the MOS transistor becomes low when the width (W) of the channel region is wide, while the resistance becomes high when the length (L) is long. Therefore, the resistance value can be changed for each N-channel MOS transistor by changing the width (W) and length (L) of the channel region. Also, the ON resistance can be changed by changing a gate voltage applied to each N-channel MOS transistor. Accordingly, the ability of the N-channel MOS transistor can be changed for each block by changing at least one selected from the channel width (W), the channel length (L) and the gate voltage.

In the example shown in FIG. 3, the ability of the N-channel MOS transistor is varied by changing the width (W) of the channel region of the N-channel MOS transistor.

Referring to FIG. 1 together with FIG. 3, the source switch SS1 is connected to the group G1 which is composed of the block B1 closest to the ground pad 12. The source switch SS1 comprises a N-channel MOS transistor N1 having a channel width of 1000 $\mu$m. In addition, the source switches SS2 and SS3 are connected to the group G2 composed of the blocks B2 and B3 and comprise N-channel MOS transistors N2 and N3 having the channel width of 1300 $\mu$m. Likewise, the source switches SS4 and SS5 (not shown in FIG. 3) are connected to the group G3 composed of the blocks B4 and B5 and comprise N-channel MOS transistors N4 and N5, respectively, each having a channel width of 1500 $\mu$m. In a like manner, the source switches SS6 and SS7 are connected to the group G4 composed of the blocks B6 and B7 and comprise N-channel MOS transistors N6 and N7, respectively, each having a channel width of 1800 $\mu$m. Furthermore, the source switch SS8 is connected to the group G5 composed of the block B8 farthest from the ground pad 12 and comprises a N-channel MOS transistor N8 having the channel width of 2000 $\mu$m.

Thus, the N-channel MOS transistors each of which has the channel widths variable within the range of 1000 to 2000 $\mu$m are arranged in consideration of the position of each of the blocks B1 to B8. As a result, a sum of the resistance of the ground wiring 26 extended from the ground pad 12 to each of source switches SS1 to SS8 and the ON resistance of each of the N-channel MOS transistors becomes substantially equal to one another. Thereby, the variation of the ground potential in each block can be substantially eliminated during the writing operation. Consequently, the writing depth and the writing duration of each memory cell become substantially constant for each block.

In FIG. 3, a negative pulse signal is supplied as the program signal TPG during the erasing operation, and thereby each of the P-channel MOS transistors P1 to P8 in each of the source switches SS1 to SS8 periodically is kept in an ON state. As a result, the high voltage Vpp from the power source pad 11 is supplied to each of block common supply wiring lines BC1 to BC8 via the erasing voltage supply line 25 and the P-channel MOS transistors P1 to P8. Thus, the erasing operation is carried out for the blocks B1 to B8.

The high voltage Vpp which is given during the erasing operation is influenced by the resistance and the capacity of the erasing voltage supply line 25. Thereby, the voltage Vpp is successively reduced through the block 8 (closest to the power supply pad 11) to the block B1 (farthest from the power supply pad 11). Thus, where an erasing voltage given to each of the blocks B1 to B8 is varied by the erasing voltage supply line 25, the threshold value of each memory cell in each block due to the variable erasing voltage given during the erasing operation is fluctuated. If the erasing operation is repeated many times to prevent the fluctuation of the threshold value, the memory cells might be excessively erased. Such excessive erasure brings about a defect of a product.

To solve this problem, for example, the ability of the P channel MOS transistor P8 in the source switch SS8 (closest to the power supply pad 11) may be reduced, while the ability of the P-channel MOS transistor P1 in the source switch SS1 (farthest from the power source pad 11) might be increased. This structure is effective to prevent the fluctuation of the erasing voltage. Specifically, the channel width (W) and the channel length (L) of the P-channel MOS transistors P1 to P8 may be determined so that the ON resistances of the P-channel transistors P8 to P1 successively are reduced in dependency upon distances from the power supply terminal 11.

Subsequently, description will be made about an example of the erasing operation of the semiconductor memory device illustrated in FIGS. 1 and 3.

An erasing pulse is supplied to all blocks B1 to B8 as the program signal TPG, while the high voltage Vpp is given as the erasing voltage for all blocks B1 to B8 via the power supply pad 11, the erasing voltage supply line 25, and the P-channel MOS transistors P1 to P8 in the source switches SS1 to SS8.

Subsequently, a desired potential is given to the block B8 closest to the power supply pad 11 to verify the erasing operation. As a result of this verification, where the block B8 is erased, the erasing verification is performed for the block B7 adjacent to the block B8. Thereafter, the erasing verification is successively performed from the block closest to the power supply pad 11 to the block B1 farthest from the power supply pad 11 in a similar manner. Thus, the illustrated semiconductor memory device is advantageous in that an erasing duration can be shortened, since the erasing verification is successively carried out from the block closest to the power supply pad 11 to the farthest one after all blocks B1 to B8 are erased.

Second Embodiment

Figure 4:
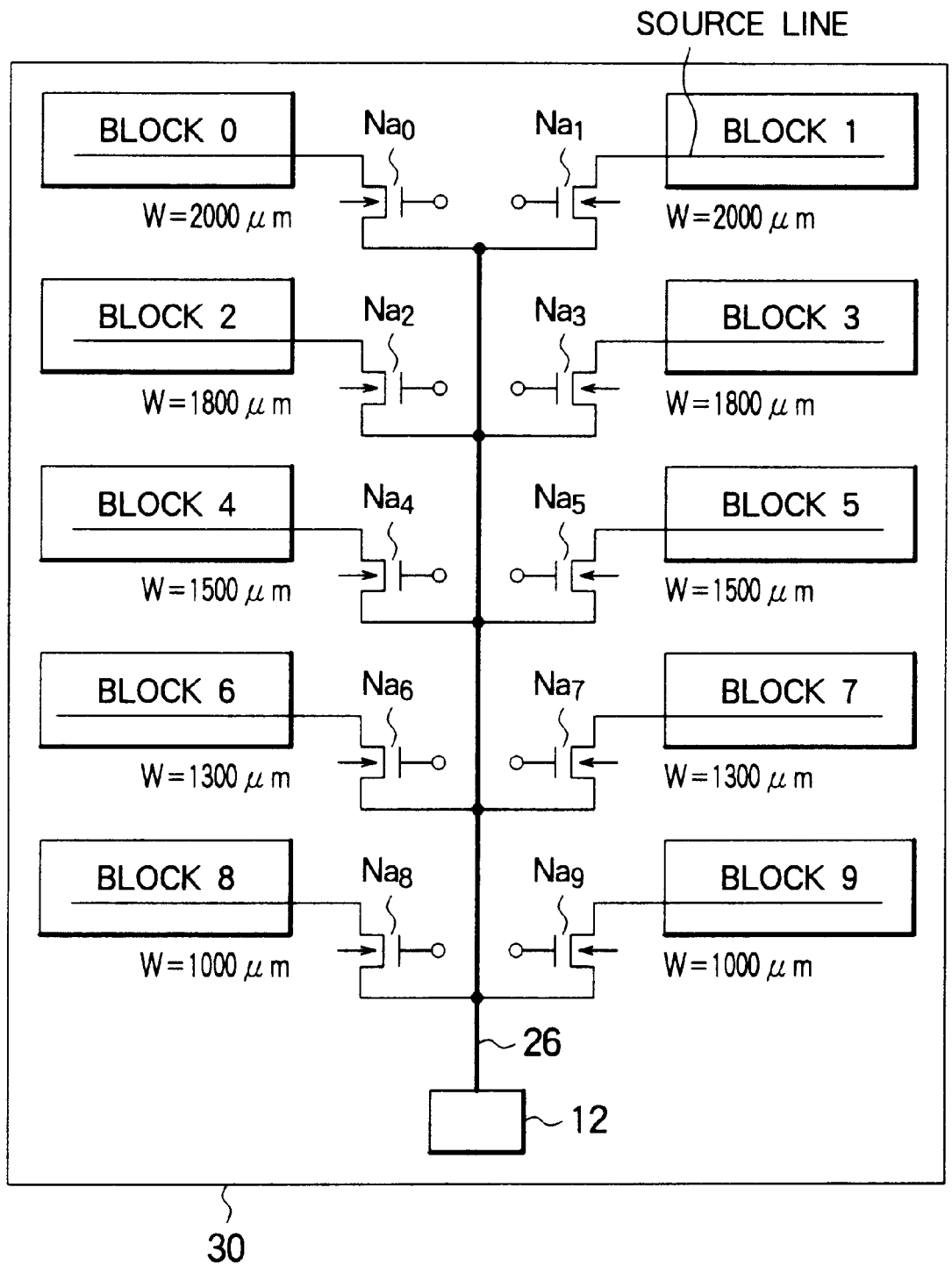
FIG. 4 shows a semiconductor memory device according to a second embodiment of this invention.

Referring to FIG. 4, a semiconductor memory device according to a second embodiment of this invention will be described and is specified by a flash memory.

The flash memory includes ten blocks numbered from zero (0) to 9 in a chip 30. These ten blocks are symmetrically arranged in the righthand side and the lefthand side with respect to the ground line 26. In the illustrated example, the blocks 0, 2, 4, 6 and 8 of even numbers are arranged on the lefthand side, while the blocks 1, 3, 5, 7 and 9 of odd numbers are arranged on the righthand side. The blocks 0 to 9 are connected to the ground line 26 via the source switches of the N-channel MOS transistors Na0 to Na9. In the illustrated example, the N-channel MOS transistors Na8 and Na9 are connected to the blocks 8 and 9 closest to the ground pad 12. Each of the N-channel MOS transistors Na8 and Na9 has a channel width(W) of 1000 $\mu$m, while each of the adjacent N-channel MOS transistors Na6 and Na7 has the channel width (W) of 1300 $\mu$m, wider than the N-channel MOS transistors Na8 and Na9.

Likewise, the N-channel MOS transistors have wider channel widths (W) as they become remote from the ground pad 12. In the illustrated example, each of the N-channel MOS transistors Na4 and Na5 has the channel width (W) of 1500 $\mu$m, while each of the N-channel MOS transistors Na2 and Na3 has the channel width (W) of 1800 $\mu$m. Further, each of the N-channel MOS transistors Na0 and Na1 has the channel width of 2000 $\mu$m. With this structure, the variation of the ground potential of each block can be prevented during the writing operation.

Third Embodiment

Figure 5:
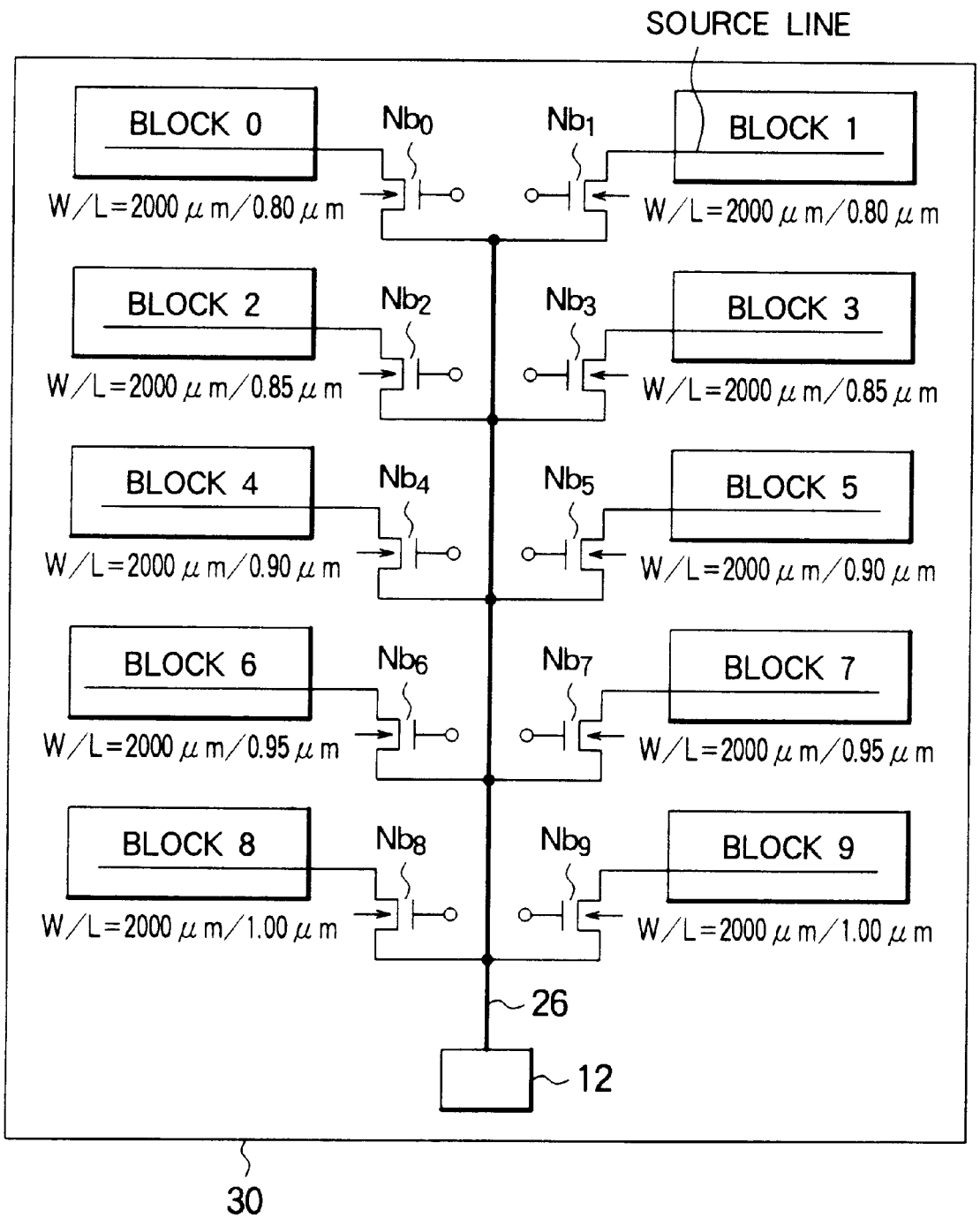
FIG. 5 shows a semiconductor memory device according to a third embodiment of this invention.

Referring to FIG. 5, a semiconductor device according to a third embodiment of this invention will be described and is also specified by a flash memory.

In the illustrated example, the N-channel MOS transistors Nb0 to Nb9 are operable as source switches and are different from the N-channel MOS transistors Na0 to N29 shown in FIG. 4. Namely, each of the N-channel MOS transistors Nb0 and Nb1 has a channel width (W) of 2000 $\mu$m and a channel length(L) of 0.80 $\mu$m, while each of the N-channel MOS transistors Nb2 and Nb3 has the channel width (W) of 2000 $\mu$m and the channel length(L) of 0.85 $\mu$m. Further, each of the N-channel MOS transistors Nb4 and Nb5 has the channel width(W) of 2000 $\mu$m and the channel length(L) of 0.90 $\mu$m, while each of the N-channel MOS transistors Nb6 and Nb7 has the channel width(W) of 2000 $\mu$m and the channel length(L) of 0.95 $\mu$m.

Similarly, each of the N-channel MOS transistors Nb8 and Nb9 closest to the ground pad 12 has the channel width (W) of 2000 $\mu$m and the channel length(L) of 1.00 $\mu$m. Thus, the channel length (L) becomes shorter to enhance the ability of the transistor as the transistor is farther from the ground pad 12. As a result, the variation of the ground potential in each block can be substantially eliminated during the writing operation. In this case, the same voltage Vg (12.0V) may be given to the gate of each MOS transistor in the examples shown in FIGS. 4 and 5.

Fourth Embodiment

Figure 6:
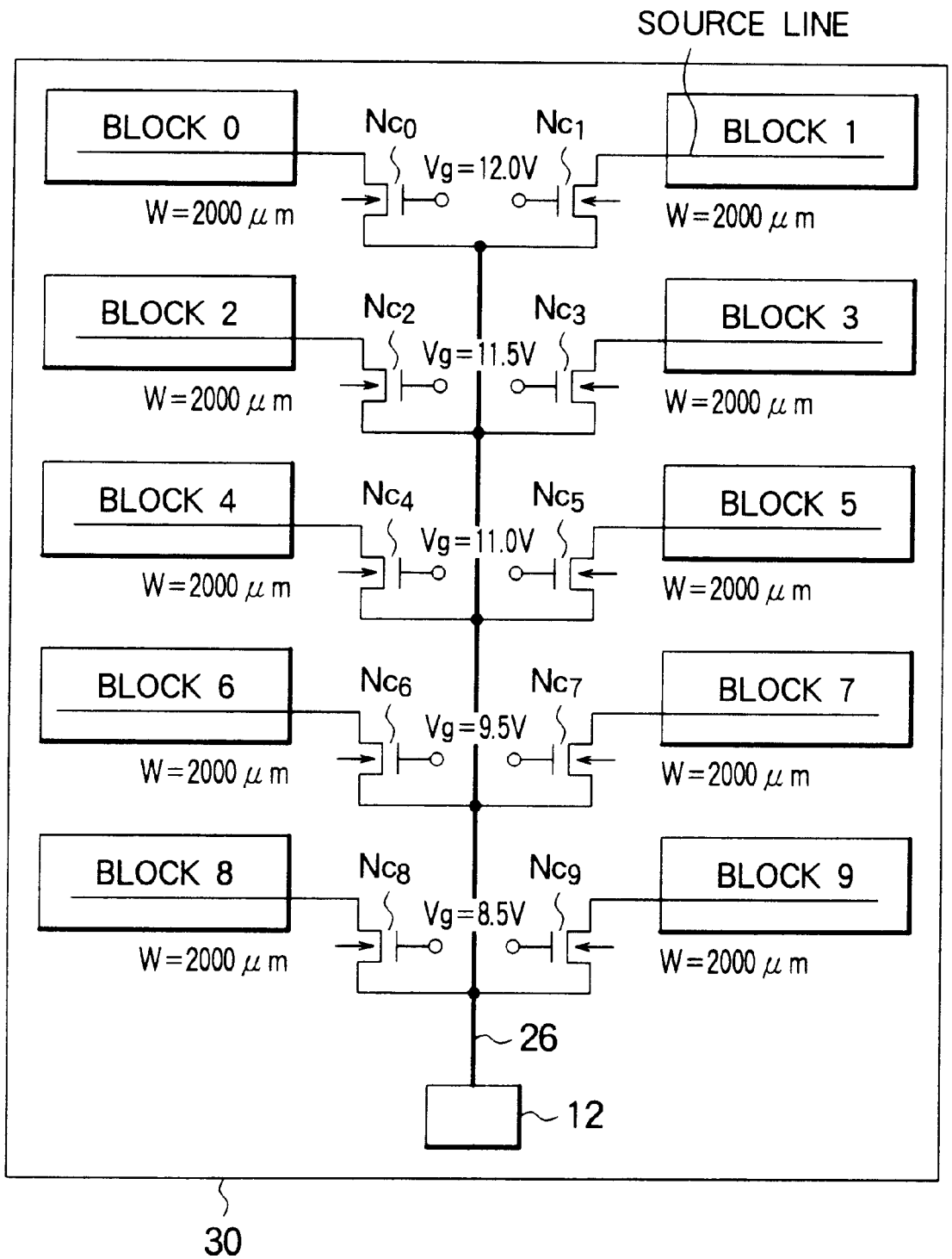
FIG. 6 shows a semiconductor memory device according to a fourth embodiment of this invention.

Referring to FIG. 6, a semiconductor device according to a fourth embodiment of this invention will be described and is also specified by a flash memory.

In the example illustrated, N-channel MOS transistors Nc0 to Nc9 are operable as source switches and are connected to blocks 0 to 9, respectively. Each of the N-channel MOS transistors Nc0 to Nc9 has the same channel width (W) and channel length (L) to each other. In this event, a higher gate voltage is given to the N-channel MOS transistors Nc0 to Nc9 as the transistor becomes father from the ground pad 12. Thereby, the ability of the transistor far from the ground pad 12 is increased. Consequently, the variation due to the resistance and the capacity of the ground wiring 26 is eliminated.

Specifically, the gate voltage (Vg) of 12.0 V is given to each of the N-channel MOS transistors Nc0 and Nc1, while the gate voltage (Vg) of 11.5 V is given to each of the N-channel MOS transistors Nc2 and Nc3. Further, the gate voltage (Vg) of 11.0V is given to each of the N-channel MOS transistors Nc4 and Nc5, while the gate voltage (Vg) of 9.5 V is given to each of the N-channel MOS transistors Nc6 and Nc7.

In addition, the gate voltage(Vg) of 8.5 V is given to each of the N-channel MOS transistors Nc8 and Nc9. With such a structure, the variation of the ground potential can be eliminated.

At any rate, the ability of each transistor in the source switches is varied in consideration of a distance between the ground pad 12 and each source switch.

While this invention has thus far been disclosed in conjunction with several embodiments thereof, it will be readily possible for those skilled in the art to put this invention into practice in various other manners. For example, a combination of a channel width, a channel length and a gate voltage may be changed in relation to a distance between the ground pad and each source switch. In addition, the transistors in the source switches may be replaced by bipolar transistors. Moreover, the present invention may not be restricted to the flash memory but an EEPROM.

What is claimed is:

1. A semiconductor memory device comprising:
    a plurality of memory arrays, each of which includes a plurality of memory cells;
    a terminal for giving a potential to said memory arrays via a reference line; and
    a plurality of switches electrically connected to said memory arrays and the reference line, said switches selectively transferring said potential to each of said memory arrays;
    wherein each of said switches includes a transistor having an electrical ability based on a length of the reference line between said each switch and said terminal.

2. A semiconductor memory device claimed in claim 1 wherein:
    said terminal is a ground terminal for giving a ground potential to said memory cell during a writing operation of said memory cell.

3. A semiconductor memory device claimed in claim 1 wherein:
    said terminal is a power supply terminal for supplying a voltage to said memory cell during an erasing operation of said memory cell.

4. A semiconductor memory device claimed in claim 1 wherein:
    each of said memory cells comprises a non-volatile memory cell, said non-volatile memory cell having a source, a drain, a floating gate and a control gate.

5. A semiconductor memory device claimed in claim 4 wherein:
    each of said switches is connected to the source of said non-volatile memory cell; and
    said potential is selectively transferred to the source.

6. A semiconductor memory device claimed in claim 4 wherein:
    said non-volatile memory cell comprises a flash memory cell.

7. A semiconductor memory device claimed in claim 1 wherein:
    said transistor comprises a MOS transistor having a channel region and a gate,
    the channel region being defined by a width and a length, while a gate voltage is applied to the gate to turn on the MOS transistor.

8. A semiconductor memory device claimed in claim 7, said MOS transistor having an ON resistance when it is turned on, wherein:
    said electrical ability is specified by the ON resistance of said MOS transistor.

9. A semiconductor memory device claimed in claim 8 wherein:
    said MOS transistor of said each switch is designed so that its ON resistance is lower as the length of the reference line between said each switch and said terminal becomes longer.

10. A semiconductor memory device claimed in claim 9 wherein:
    the ON resistance is determined by the width of the channel region, and
    wherein the width of the channel region becomes wider as the length of the reference line becomes longer.

11. A semiconductor memory device claimed in claim 9 wherein:
    the ON resistance is determined by the length of the channel region, and
    the length of the channel region becomes shorter as the length of the reference line becomes longer.

12. A semiconductor memory device claimed in claim 9 wherein:
    the ON resistance is determined by the gate voltage, and
    the gate voltage becomes higher as the length of the reference line becomes longer.

13. A semiconductor memory device comprising:
    a plurality of memory arrays, each of which includes a plurality of memory cells;
    a plurality of switches connected said memory arrays, each of the switches including first and second transistors which have a first electrical ability and a second electrical ability, respectively;
    a first terminal connected to said first transistor of each switch via a first reference line, said first transistor being turned on during a writing operation of said memory cell to transfer a ground potential to said memory cell;
    a second terminal connected to said second transistor of each switch via a second reference line, said second transistor being turned on during an erasing operation of said memory cell to transfer a predetermined voltage to said memory cell;
    the first electrical ability being determined by a length of the first reference line between said first transistor of each source switch and said first terminal, and
    the second electrical ability being determined by a length of the second reference line between said second transistor of each source switch and said second terminal.

14. A semiconductor memory device claimed in claim 13 wherein:
    said first transistor is a N-channel MOS transistor, said first reference line being connected to a source of said N-channel MOS transistor, and
    said second transistor is a P-channel MOS transistor, said second reference line being connected to a source of said P-channel MOS transistor.

15. A semiconductor memory device claimed in claim 14, the N-channel and the P-channel MOS transistors having first and second ON resistances when they are turned on, respectively, wherein;
    said first electrical ability is featured by the first ON resistance of said N-channel MOS transistor and, said second electrical ability is featured by the second ON resistance of said P-channel MOS transistor.

16. A semiconductor memory device claimed in claim 15 wherein:

the first ON resistance becomes lower as the length of the first reference line between said switch and said first terminal becomes longer, and the second ON resistance becomes lower as the length of the second reference line between said switch and said second terminal becomes longer.

17. A semiconductor memory device comprising:

a first plurality of memory cells;

a second plurality of memory cells;

a terminal for supplying a potential to said first plurality of memory cells and said second plurality of memory cells via a conductor;

said conductor having:
- a first node defining a first length from said terminal;
- a second node defining a second length from said terminal, wherein said second length from said terminal is greater than said first length from said terminal;
- a first resistance defined by the first length from said terminal; and
- a second resistance defined by the second length from said terminal;

a first switch electrically connected to said first plurality of memory cells and said first node of said conductor, said first switch selectively electrically connecting said first node to said first plurality of memory cells;

a second switch electrically connected to said second plurality of memory cells and said second node of said conductor, said second switch selectively electrically connecting said second node to said second plurality of memory cells;

wherein said first switch includes a first transistor having a first electrical ability based on said first length from said terminal; and wherein said second switch includes a second transistor having a second electrical ability based on said second length from said terminal.

18. A semiconductor memory device as claimed in claim 17 wherein:

said first transistor having a first ON resistance when it is turned on, said first transistor comprising:
- a first channel region;
- a first gate; and
- wherein said first channel region is defined by a first channel width and a first channel length, while the first gate is responsive to a first gate voltage; and said second transistor having a second ON resistance, said second transistor comprising:
- a second channel region;
- a second gate; and
- wherein said second channel region is defined by a second channel width and a second channel length, while the second gate is responsive to a second gate voltage.

19. A semiconductor memory device as claimed in claim 18 wherein:

said first and second electrical abilities are specified by said first and second ON resistances, respectively; and wherein said second ON resistance is lower than said first ON resistance.

20. A semiconductor memory device as claimed in claim 19 wherein:

the second channel width is wider than the first channel width, whereby the second ON resistance is lower than the first ON resistance.

21. A semiconductor memory device as claimed in claim 19 wherein:

the second channel length is shorter than the first channel length, whereby the second ON resistance is lower than the first ON resistance.

22. A semiconductor memory device as claimed in claim 19 wherein:

the second gate voltage is greater than the first gate voltage, whereby the second ON resistance is lower than the first ON resistance.

23. A semiconductor memory device as claimed in claim 19 wherein:

said first resistance of said conductor and said first ON resistance provide a first series resistance;

said second resistance of said conductor and said second ON resistance provide a second series resistance; and wherein said first series resistance is substantially equal to said second series resistance.

* * * * *